United States Patent [19]

Coker et al.

[11] Patent Number: 5,268,848
[45] Date of Patent: Dec. 7, 1993

[54] EQUALIZER ADJUSTMENT FOR PARTIAL-RESPONSE MAXIMUM-LIKELIHOOD DISK DRIVE SYSTEMS

[75] Inventors: Jonathan D. Coker; Richard L. Galbraith; Gary W. Walker, all of Rochester, Minn.

[73] Assignee: International Business Machines Corporation, Armonk, N.Y.

[21] Appl. No.: 954,085

[22] Filed: Sep. 30, 1992

[51] Int. Cl.[5] .............................................. G06F 15/31
[52] U.S. Cl. ................................................ 364/724.19
[58] Field of Search ........................ 364/724.19, 724.2; 333/18, 28 R; 375/11-15

[56] References Cited

U.S. PATENT DOCUMENTS

| | | |
|---|---|---|
| 3,614,622 | 10/1971 | Holsinger . |
| 4,227,160 | 10/1980 | Tamori et al. .................... 364/724.2 |
| 4,441,192 | 4/1984 | Kita et al. . |
| 4,707,681 | 11/1987 | Eggenberger et al. . |
| 4,888,808 | 12/1989 | Ishikawa et al. . |
| 4,899,366 | 2/1990 | Davis et al. . |
| 4,945,539 | 7/1990 | Patel . |
| 4,964,107 | 10/1990 | Galbraith et al. . |
| 4,985,902 | 1/1991 | Gurcan . |
| 5,040,191 | 8/1991 | Forney, Jr. et al. . |
| 5,060,088 | 10/1991 | Dolivo et al. ......................... 360/46 |
| 5,095,484 | 3/1992 | Karabed et al. . |
| 5,121,263 | 6/1992 | Kerwin et al. . |
| 5,132,988 | 7/1992 | Fisher et al. . |
| 5,168,413 | 12/1992 | Coker et al. ......................... 360/137 |

OTHER PUBLICATIONS

IBM Technical Disclosure Bulletin, vol. 31, No. 11 Apr. 1989, pp. 450-452.

Primary Examiner—Tan V. Mai
Attorney, Agent, or Firm—Joan Pennington; Richard E. Billion; Bradley A. Forrest

[57] ABSTRACT

Apparatus and method for providing equalization adjustment for a finite impulse response (FIR) digital filter are provided in a PRML data channel. A plurality of transformations are defined to transform effective tap weights in a digital filter into modified effective tap weight values by adding each said initial effective tap weight value with a selected cosine equalization adjustment function. A cosine expander circuit is provided for expanding 8-byte compressed equalizations into a 32-byte format and for altering the filter response by a selected cosine equalization adjustment function.

13 Claims, 4 Drawing Sheets

Fig. 4

PROF OF RAM CONSTRUCTION

Fig. 5

EQUALIZER ADJUSTMENT FOR PARTIAL-RESPONSE MAXIMUM-LIKELIHOOD DISK DRIVE SYSTEMS

BACKGROUND OF THE INVENTION

1. Field of the Invention

The present invention relates generally to a direct access storage device (DASD) of the type utilizing partial-response signaling and maximum-likelihood (PRML) detection together with digital filtering, and more particularly to apparatus and method for providing equalization adjustment for a digital filter in a PRML magnetic recording channel.

2. Description of the Prior Art

Computers often include auxiliary memory storage units having media on which data can be written and from which data can be read for later use. Disk drive units incorporating stacked, commonly rotated rigid magnetic disks are used for storage of data in magnetic form on the disk surfaces. Data is recorded in concentric, radially spaced data information tracks arrayed on the surfaces of the disks. Transducer heads driven in a path toward and away from the drive axis write data to the disks and read data from the disks. A PRML channel can be used to achieve high data density in writing and reading digital data on the disks.

To obtain full advantage of the PRML channel, the received signal or the read signal must be passed through a specially designed equalizing filter which produces at its output a signal spectrum corresponding to the wave shape for which the maximum-likelihood detector is designed. When using digital filtering in a PRML system, the filter is located between an analog-to-digital converter (ADC) and other signal processing hardware which controls the system and performs the detection.

Various equalizer adjustments have been implemented during data recovery in PRML to improve hard error rate. Typically, disadvantages of the known equalizer arrangements include first, the adaptive equalizer can exhibit systematic error in converging to a proper value for the adaptive constant, depending on offtrack conditions, external noise, and magnetic instabilities. Second, significant analog path frequency response changes which may occur in the magnetics or in the filter path may cause convergence problems due to compromise initial conditions in the adaptive loop.

U.S. patent application Ser. No. 07/851,817 filed Mar. 16, 1992 by Jonathan Darrel Coker, Richard Leo Galbraith and Pablo Alejandro Ziperovich and assigned to the present assignee, discloses a distributed arithmetic (DA) digital filter having many taps, such as a ten 10-tap filter implemented in RAM. The disclosed DA digital filter is configured with an automatic equalization architecture that does not require an adaptive loop. As a result the partial-response digital filter (PRDF) gained significant advantage in power and speed as compared to an adaptive filter that would be directly in a critical speed path of the module, and also simplicity of design. The disclosed PRDF provides 64 equalizations that can be used for example to accommodate 15 heads and 10 radial bands or 150 locations which may be marginally acceptable.

With disk files having a large number of disks, for example 12 disks, more effective equalizations are required. It is desirable to extend the power of the automatic equalization architecture significantly. Further it is desirable to provide an automatic equalization architecture that will allow simpler and faster data recovery procedure (DRP) steps without increasing the palette RAM size.

SUMMARY OF THE INVENTION

A principal object of the invention is to provide an improved equalization adjustment method and apparatus for a digital filter in a PRML magnetic recording channel in a disk file. Other objects are to provide such equalization adjustment method and apparatus substantially without negative effects and that overcome many of the disadvantages of prior art arrangements.

In brief, the objects and advantages of the present invention are achieved by apparatus and method for providing equalization adjustment for a finite impulse response (FIR) digital filter in a PRML data channel. A plurality of partial sums of predetermined tap weights are stored in a palette RAM. An odd tap weight constraint constant and an even tap weight constraint constant are generated and are used together with respective selected ones of the stored partial sums for calculating a predetermined odd tap weight and a predetermined even tap weight. Each of the odd tap weight constant value and the even tap weight constant value defines a predetermined filter coefficient. Predetermined filter coefficients are calculated and stored in a filter RAM using the calculated predetermined odd and even tap weights, predefined ones of the stored partial sums and a selected equalizer adjustment multiple of predefined different ones of the stored partial sums.

BRIEF DESCRIPTION OF THE DRAWING

The present invention together with the above and other objects and advantages may best be understood from the following detailed description of the embodiment of the invention illustrated in the drawing, wherein.

DETAILED DESCRIPTION OF THE PREFERRED EMBODIMENTS

Figure 1:
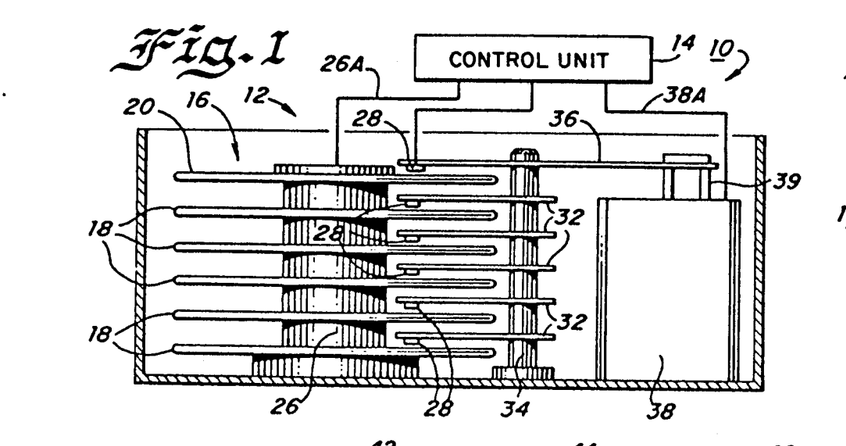
FIG. 1 is a schematic and block diagram of a data storage disk file embodying the present invention.

In FIG. 1 there is shown a partly schematic block diagram of parts of a data storage disk file 10 including a data storage medium generally designated as 12 and a control unit generally designated as 14. In the preferred embodiment of this invention, the data storage medium 12 is embodied in a rigid magnetic disk drive unit 12, although other memory configurations may be used.

Unit 12 is illustrated in simplified form sufficient for an understanding of the present invention because the utility of the present invention is not limited to the details of a particular drive unit construction.

Figure 2:
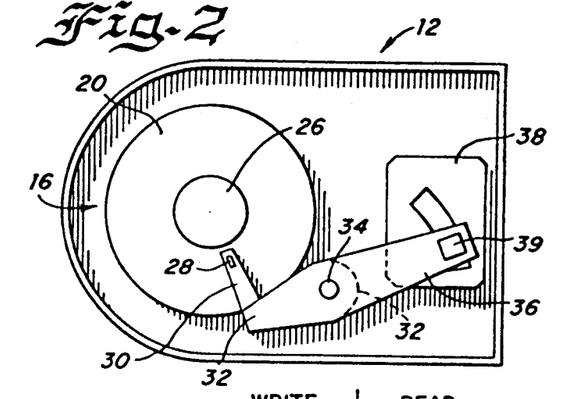
FIG. 2 is a diagram showing the accessing mechanism for a single disk surface of the apparatus of FIG. 1.

Referring now to FIGS. 1 and 2 of the drawings, disk drive unit 12 includes a stack 16 of disks 18 having at least one magnetic surface 20. The disks 18 are mounted in parallel for simultaneous rotation on and by an integrated spindle and motor assembly 26. Data information on each disk 18 are read and/or written to by a corresponding transducer head 28 movable across the disk surface 20.

Transducer heads 28 are mounted on flexure springs 30 carried by arms 32 ganged together for simultaneous pivotal movement about a support spindle 34. One of the arms 32 includes an extension 36 driven in a pivotal motion by a head drive motor 38. Although several drive arrangements are commonly used, the motor 38 can include a voice coil motor 39 cooperating with a magnet and core assembly (not seen) operatively controlled for moving the transducer heads 28 in synchronism in a radial direction in order to position the heads in registration with data cylinders to be followed. The VCM 39 is movable within a fixed magnetic field, and the direction and velocity of the coil movement is controlled by the current supplied. During operation of the disk file 10, the various components of the disk file 10 are controlled in operation by signals generated by control unit 34 such as motor control signals on line 26A and position control signals on line 38A.

Figure 3:
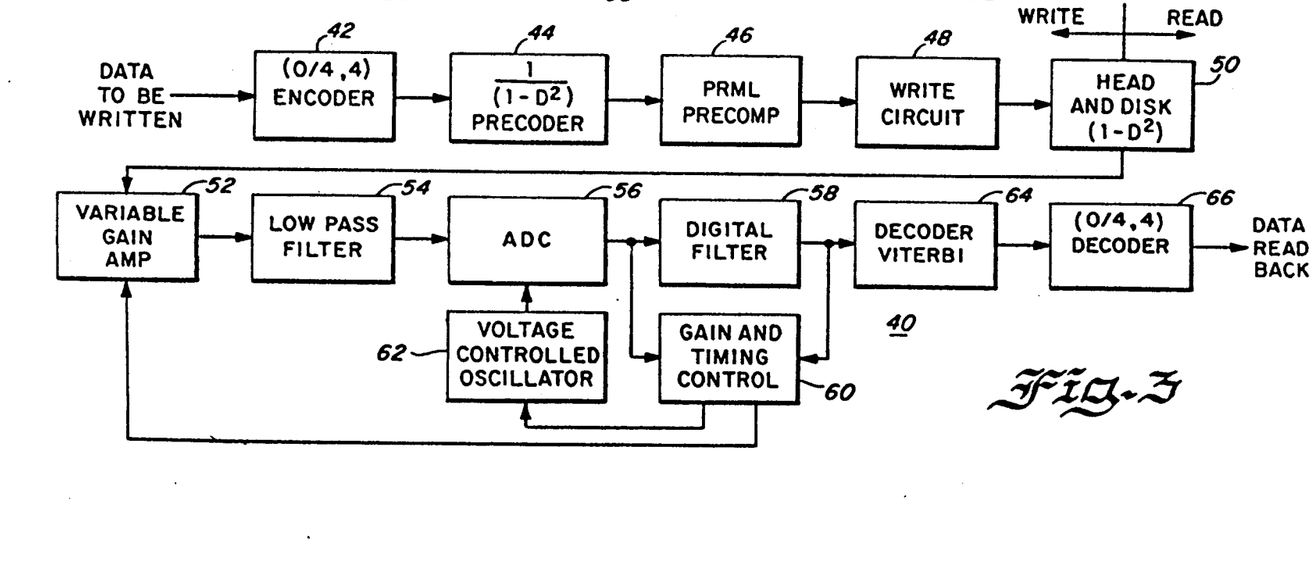
FIG. 3 is a block diagram illustrating a partial-response signaling and maximum-likelihood (PRML) channel in the data storage disk file of FIG. 1.

Referring now to FIG. 3, there is shown a block diagram of a partial-response maximum-likelihood (PRML) recording channel 40 available in the disk file 10 including a digital filter function of the invention. Data to be written is applied to an encoder 42 for providing a modulation coded output having predefined run length constraints, for example, such as, for the minimum and maximum number of consecutive zeros and the maximum run length of zeros in the even and odd recorded sequences in the overall recorded sequence. A precoder 44 follows the encoder 42 described by a $1/(1-D^2)$ operation where D is a unit delay operator. A PRML precomp 46 coupled to the precoder 44 provides a modulated binary pulse signal applied to a write circuit to the disk surface. An analog read signal is obtained at head and disk block 50 described by the $(1-D^2)$ operation. The read signal is applied to a variable gain amplifier (VGA) 52 and the amplified read signal is applied to a lowpass filter 54. The filtered read signal is converted to digital form by an analog-to-digital converter (ADC) 56 that provides, for example, such as 64 possible 6-bit sampled values.

The samples of the ADC 56 are applied to a digital filter 58, such as a 10 tap finite impulse response (FIR) digital filter arranged in accordance with the invention, and are applied to a gain and timing control 60. The gain and timing control 60 provides a gain and control signal to the VGA 52 and provides a timing control signal to the ADC 56 via a voltage controlled oscillator 62. The filtered signal from the digital filter 58 is applied to a Viterbi decoder 64 coupled to a decoder 66 to complete the maximum-likelihood (ML) detection process for data read back.

In accordance with the present invention, the digital filter 58 includes a cosine equalizer function. The transfer function of a cosine equalizer is defined by:

$$H(f) = 2K\cos(2\pi fT) + 1$$

The cosine equalizer function provides an effective first order approximation for correcting the change in frequency response as the head moves from the inner diameter to the outer diameter of the disk. The cosine equalizer function does not alter phase response except for a fixed group delay. The present invention works via a transformation of currently loaded equalization, which is implemented in a FIR digital filter 58. These transformations are obtained by modelling a 10-tap FIR filter followed by a simple 3-tap cosine equalizer, and approximating the result back to a 10-tap filter, in such a way that the transformations preserve the gain and timing constraints on the filter at the synchronization field frequency. If K is positive, the modified equalizer broadens signal pulses; if K is negative, the modified equalizer slims signal pulses. The theoretical transformation on the set of tap weights $T_1$ through $T_{10}$ is:

$$T_{1'} = T_1 + KT_2$$

$$T_{2'} = T_2 + KT_3$$

$$T_{3'} = KT_2 + T_3 + KT_4$$

$$T_{4'} = KT_3 + T_4 + KT_5$$

$$T_{5'} = KT_4 + T_5 + KT_6$$

$$T_{6'} = KT_5 + T_6 + KT_7$$

$$T_{7'} = KT_6 + T_6 + KT_8$$

$$T_{8'} = KT_7 + T_8 + KT_9$$

$$T_{9'} = KT_8 + T_9$$

$$T_{10'} = KT_9 + T_{10}.$$

Figure 7:
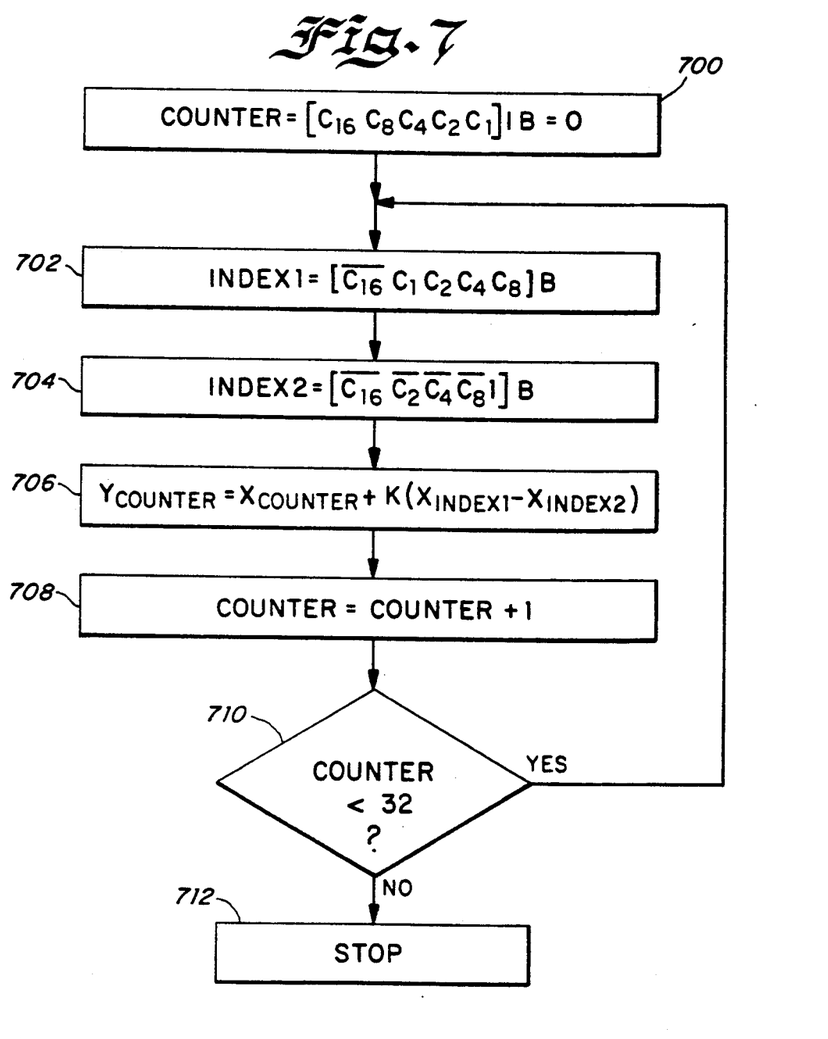
FIG. 7 is a flow chart illustrating sequential steps for providing equalization adjustment for a finite impulse response (FIR) digital filter in the PRML data channel in the data storage disk file of FIG. 1.

These equations have the same form for all FIR filter orders greater than 3. The following is an implementation of this transformation with a distributed arithmetic implementation of a 10-tap digital filter, such as for the FIR digital filter 58. This is implemented in microcode as illustrated in FIG. 7 or by hardware.

The following is a list of equations which redefine the 32 numbers which specify a directly loaded DA type equalization, where X(n) represents the initial values, X(0)...X(31), which are read from digital filter RAM. The values Y(n) represent Y(0)...Y(31), represent the modified values, to be directly loaded back to digital filter RAM.

$$Y_0 = X_0 + K(X_{16} - X_{31})$$

$$Y_1 = X_1 + K(X_{24} - X_{31})$$

$$Y_2 = X_2 + K(X_{20} - X_{23})$$

$$Y_3 = X_3 + K(X_{28} - X_{23})$$

$$Y_4 = X_4 + K(X_{18} - X_{27})$$

$$Y_5 = X_5 + K(X_{26} - X_{27})$$

$$Y_6 = X_6 + K(X_{22} - X_{19})$$

$$Y_7 = X_7 + K(X_{30} - X_{19})$$

$Y_8 = X_8 + K(X_{17} - X_{29})$ $Y_9 = X_9 + K(X_{25} - X_{29})$ $Y_{10} = X_{10} + K(X_{21} - X_{21})$ $Y_{11} = X_{11} + K(X_{29} - X_{21})$ $Y_{12} = X_{12} + K(X_{19} - X_{25})$ $Y_{13} = X_{13} + K(X_{27} - X_{25})$ $Y_{14} = X_{14} + K(X_{23} - X_{17})$ $Y_{15} = X_{15} + K(X_{31} - X_{17})$ $Y_{16} = X_{16} + K(X_0 - X_{15})$ $Y_{17} = X_{17} + K(X_8 - X_{15})$ $Y_{18} = X_{18} + K(X_4 - X_7)$ $Y_{19} = X_{19} + K(X_{12} - X_7)$ $Y_{20} = X_{20} + K(X_2 - X_{11})$ $Y_{21} = X_{21} + K(X_{10} - X_{11})$ $Y_{22} = X_{22} + K(X_6 - X_3)$ $Y_{23} = X_{23} + K(X_{14} - X_3)$ $Y_{24} = X_{24} + K(X_1 - X_{13})$ $Y_{25} = X_{25} + K(X_9 - X_{13})$ $Y_{26} = X_{26} + K(X_5 - X_5)$ $Y_{27} = X_{27} + K(X_{13} - X_5)$ $Y_{28} = X_{28} + K(X_3 - X_9)$ $Y_{29} = X_{29} + K(X_{11} - X_9)$ $Y_{30} = X_{30} + K(X_7 - X_1)$ $Y_{31} = X_{31} + K(X_{15} - X_1)$

It should be understood that many forms of the transformation are possible. This particular set was chosen for minimum complexity and minimum roundoff error. These can be implemented in one "for" loops as illustrated and described with respect to FIG. 7.

In accordance with feature of the invention, the appropriate equalization index should be re-loaded into the appropriate PRDF registers before any K-adjust operation takes place. This takes approximately ¼ of a sector time to complete and will prevent compounding frequency response modifications. The equalization adjustment operates on the 32 8-bit numbers in the digital filter RAM as opposed to the palette RAM. This will ensure that the palette RAM values remain non-volatile after power-up. The equalization adjustment requires no real number arithmetic. All multiplicands, except for K, are 1 or −1. Multiplies involving K should be done with an assembly level microprocessor instruction, such as IMUL instruction or hardware arranged to preserve flexibility in choice of K value.

FIG. 7 illustrates sequential steps for a preferred distributed arithmetic software implementation of the equalizer adjustment transformations for $Y_0 \ldots Y_{31}$. In current DRP listings, the equalizer steps denote "read with $\pm n$", where n specifies the value of K, given a step-size (call it $\delta$). Thus, for the different DRP steps, the value $K = n\delta$. The value $\delta$ is set at $\delta = 0.125$. The sequential operations begin with setting a counter at a block 700 as labelled COUNTER = $[C_{16}C_8C_4C_2C_1]B = 0$. Then a first index is set at a block 702 as labelled INDEX1 = $[\overline{C_{16}}C_1C_2C_4C_8]B$ and a second index is set at a block 704 as labelled INDEX2 = $[\overline{C_{16}C_8C_4C_2}1]B$. Next a first equalizer adjustment transformation $Y_0$ is calculated at a block 706 as labelled $Y_{COUNTER} = X_{COUNTER} + K[X_{INDEX1} - X_{INDEX2}]$. At a decision block 710 labelled COUNTER<32?, the counter value is compared with 32. Next the count value is incremented by 1 at a block 708 labelled COUNTER = COUNTER+1. When the counter is less than 32, then the sequential operations are repeated returning to block 702 until all the transformation through $Y_{31}$ are calculated. When the counter value equals 32, the operations are completed at a block 712 labelled STOP.

The following table 1 provides the calculated transformation index values provided by the sequential operation shown in FIG. 7.

TABLE 1

| COUNTER | $C_{16}$ | $C_8$ | $C_4$ | $C_2$ | $C_1$ | INDEX1 | INDEX2 |
|---|---|---|---|---|---|---|---|
| 0 | 0 | 0 | 0 | 0 | 0 | 16 | 31 |
| 1 | 0 | 0 | 0 | 0 | 1 | 24 | 31 |
| 2 | 0 | 0 | 0 | 1 | 0 | 20 | 23 |
| 3 | 0 | 0 | 0 | 1 | 1 | 28 | 23 |
| 4 | 0 | 0 | 1 | 0 | 0 | 18 | 27 |
| 5 | 0 | 0 | 1 | 0 | 1 | 26 | 27 |
| 6 | 0 | 0 | 1 | 1 | 0 | 22 | 19 |
| 7 | 0 | 0 | 1 | 1 | 1 | 30 | 19 |
| 8 | 0 | 1 | 0 | 0 | 0 | 17 | 29 |
| 9 | 0 | 1 | 0 | 0 | 1 | 25 | 29 |
| 10 | 0 | 1 | 0 | 1 | 0 | 21 | 21 |
| 11 | 0 | 1 | 0 | 1 | 1 | 29 | 21 |
| 12 | 0 | 1 | 1 | 0 | 0 | 19 | 25 |
| 13 | 0 | 1 | 1 | 0 | 1 | 27 | 25 |
| 14 | 0 | 1 | 1 | 1 | 0 | 23 | 17 |
| 15 | 0 | 1 | 1 | 1 | 1 | 31 | 17 |
| 16 | 1 | 0 | 0 | 0 | 0 | 0 | 15 |
| 17 | 1 | 0 | 0 | 0 | 1 | 8 | 15 |
| 18 | 1 | 0 | 0 | 1 | 0 | 4 | 7 |
| 19 | 1 | 0 | 0 | 1 | 1 | 12 | 7 |
| 20 | 1 | 0 | 1 | 0 | 0 | 2 | 11 |
| 21 | 1 | 0 | 1 | 0 | 1 | 10 | 11 |
| 22 | 1 | 0 | 1 | 1 | 0 | 6 | 3 |
| 23 | 1 | 0 | 1 | 1 | 1 | 14 | 3 |
| 24 | 1 | 1 | 0 | 0 | 0 | 1 | 13 |
| 25 | 1 | 1 | 0 | 0 | 1 | 9 | 13 |
| 26 | 1 | 1 | 0 | 1 | 0 | 5 | 5 |
| 27 | 1 | 1 | 0 | 1 | 1 | 13 | 5 |
| 28 | 1 | 1 | 1 | 0 | 0 | 3 | 9 |
| 29 | 1 | 1 | 1 | 0 | 1 | 11 | 9 |
| 30 | 1 | 1 | 1 | 1 | 0 | 7 | 1 |
| 31 | 1 | 1 | 1 | 1 | 1 | 15 | 1 |

Figure 4:
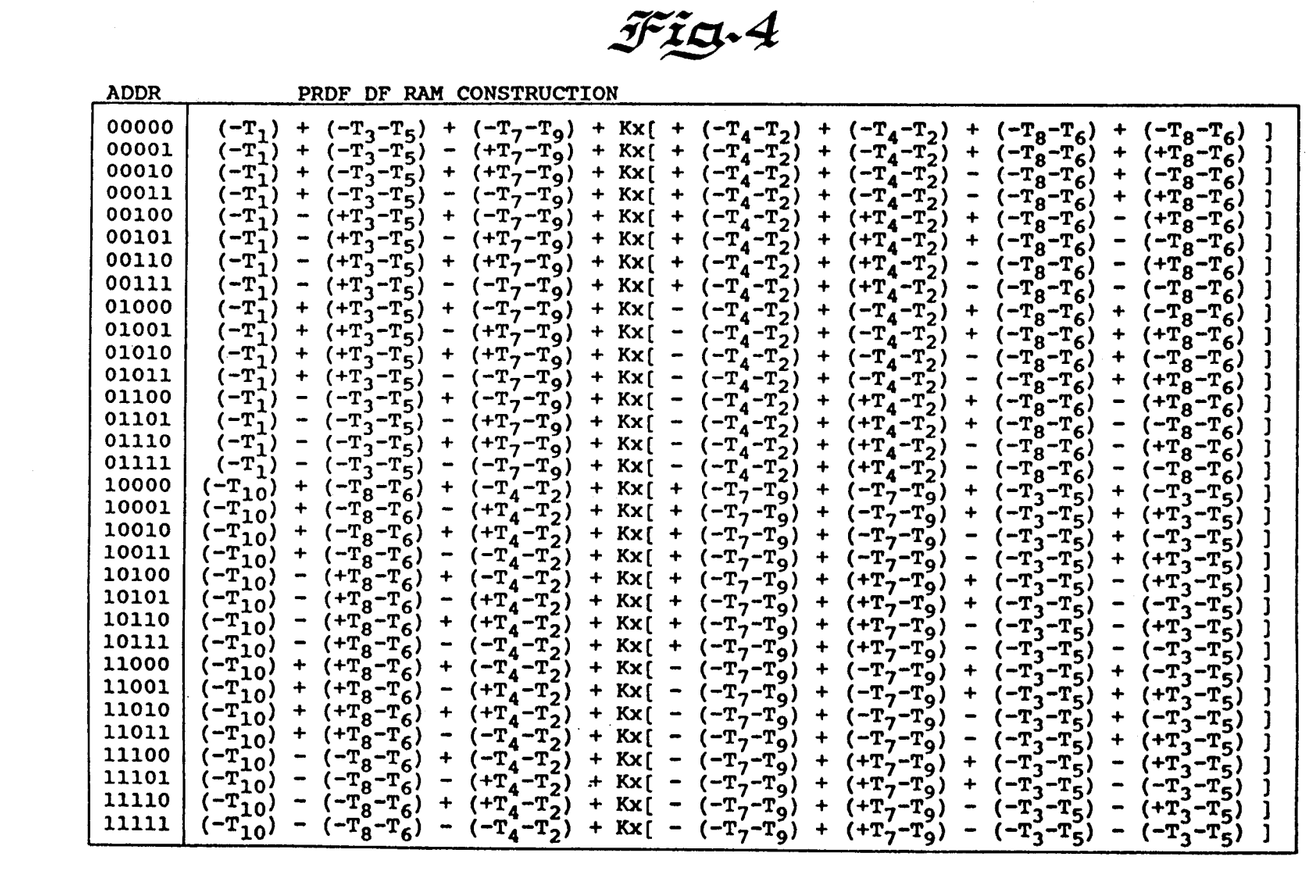
FIG. 4 is a chart illustrating a RAM construction of a digital filter having an equalization adjustment architecture of the invention.
Figure 5:
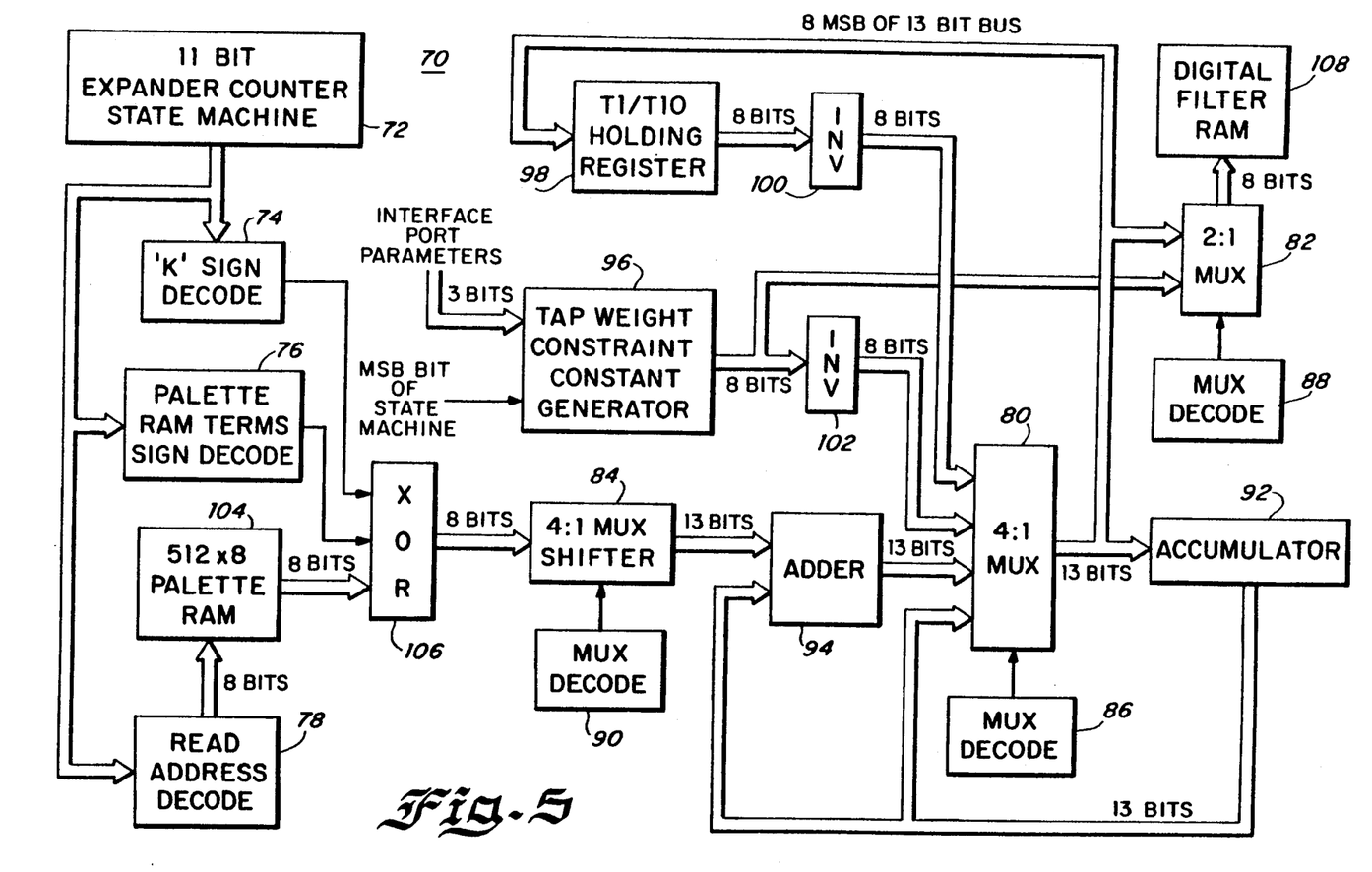
FIG. 5 is a block diagram of an equalization adjustment circuitry of the present invention.
Figure 6:
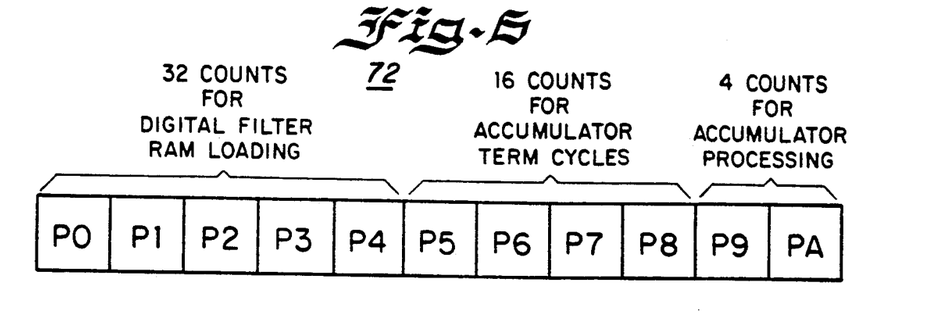
FIG. 6 is a chart illustrating a state machine bit definition of a state machine of the equalization adjustment circuitry of FIG. 5.

Having reference now to FIGS. 4–6, a hardware equalization expander circuit 70 providing the cosine equalizer function si illustrated. First, the tap weights must obey one of the following constraints:

$$\sum_{n=1}^{10} T_n e^{j2\pi n} = \begin{cases} \pm 1 + j0 \\ 0 \pm j \\ \pm\sqrt{2} \pm j\sqrt{2} \\ \mp\sqrt{2} \pm j\sqrt{2} \end{cases}$$

These constraints required for synchronization reasons reduce the degrees of freedom in a 10-tap filter to 8 so that given any 8 tap weights, the other 2 are fixed.

Utilizing these constraints, 2 tap weights are derived from the 8 given numbers, defined as follows:

$$-T_1 + T_3 - T_5 + T_7 - T_9 = K_1$$

$$-T_{10} + T_8 - T_6 + T_4 - T_2 = K_2$$

When four even taps are given, the fifth is calculable given $K_2$. Similarly, when four odd taps are given, the fifth is calculable given $K_1$.

The 8 tap weights are stored in a palette RAM storage as follows:

TABLE 2

| PRDF PALETTE RAM TABLE CONTENTS | |
|---|---|
| ADDRESS | ENTRY |
| $A_0A_1A_2A_3A_4A_5 000$ | $(-T_3 - T_5)$ |
| $A_0A_1A_2A_3A_4A_5 001$ | $(+T_3 - T_5)$ |
| $A_0A_1A_2A_3A_4A_5 010$ | $(-T_7 - T_9)$ |
| $A_0A_1A_2A_3A_4A_5 011$ | $(+T_7 - T_9)$ |
| $A_0A_1A_2A_3A_4A_5 100$ | $(-T_8 - T_6)$ |
| $A_0A_1A_2A_3A_4A_5 101$ | $(+T_8 - T_6)$ |
| $A_0A_1A_2A_3A_4A_5 110$ | $(-T_4 - T_2)$ |
| $A_0A_1A_2A_3A_4A_5 111$ | $(+T_4 - T_2)$ |

Digital filter 58 stores the 32 numbers in its internal RAM as follows:

TABLE 3

| ADDR | BASE ENTRY | COSINE EQUALIZER ADJUSTMENT |
|---|---|---|
| 00000 | $-T_1-T_3-T_5-T_7-T_9$ | $+2K[-T_2-T_4-T_6-T_8]$ |
| 00001 | $-T_1-T_3-T_5-T_7+T_9$ | $+2K[-T_2-T_4-T_6]$ |
| 00010 | $-T_1-T_3-T_5+T_7-T_9$ | $+2K[-T_2-T_4]$ |
| 00011 | $-T_1-T_3-T_5+T_7+T_9$ | $+2K[-T_2-T_4+T_8]$ |
| 00100 | $-T_1-T_3+T_5-T_7-T_9$ | $+2K[-T_2-T_8]$ |
| 00101 | $-T_1-T_3+T_5-T_7+T_9$ | $+2K[-T_2]$ |
| 00110 | $-T_1-T_3+T_5+T_7-T_9$ | $+2K[-T_2+T_6]$ |
| 00111 | $-T_1-T_3+T_5+T_7+T_9$ | $+2K[-T_2+T_6+T_8]$ |
| 01000 | $-T_1+T_3-T_5-T_7-T_9$ | $+2K[-T_6-T_8]$ |
| 01001 | $-T_1+T_3-T_5-T_7+T_9$ | $+2K[-T_6]$ |
| 01010 | $-T_1+T_3-T_5+T_7-T_9$ | 0 |
| 01011 | $-T_1+T_3-T_5+T_7+T_9$ | $+2K[+T_8]$ |
| 01100 | $-T_1+T_3+T_5-T_7-T_9$ | $+2K[+T_4-T_8]$ |
| 01101 | $-T_1+T_3+T_5-T_7+T_9$ | $+2K[+T_4]$ |
| 01110 | $-T_1+T_3+T_5+T_7-T_9$ | $+2K[+T_4+T_6]$ |
| 01111 | $-T_1+T_3+T_5+T_7+T_9$ | $+2K[+T_4+T_6+T_8]$ |
| 10000 | $-T_{10}-T_8-T_6-T_4-T_2$ | $+2K[-T_9-T_7-T_5-T_3]$ |
| 10001 | $-T_{10}-T_8-T_6-T_4+T_2$ | $+2K[-T_9-T_7-T_5]$ |
| 10010 | $-T_{10}-T_8-T_6+T_4-T_2$ | $+2K[-T_9-T_7]$ |
| 10011 | $-T_{10}-T_8-T_6+T_4+T_2$ | $+2K[-T_9-T_7+T_3]$ |
| 10100 | $-T_{10}-T_8+T_6-T_4-T_2$ | $+2K[-T_9-T_3]$ |
| 10101 | $-T_{10}-T_8+T_6-T_4+T_2$ | $+2K[-T_9]$ |
| 10110 | $-T_{10}-T_8+T_6+T_4-T_2$ | $+2K[-T_9+T_5]$ |
| 10111 | $-T_{10}-T_8+T_6+T_4+T_2$ | $+2K[-T_9+T_5+T_3]$ |
| 11000 | $-T_{10}+T_8-T_6-T_4-T_2$ | $+2K[-T_5-T_3]$ |
| 11001 | $-T_{10}+T_8-T_6-T_4+T_2$ | $+2K[-T_5]$ |
| 11010 | $-T_{10}+T_8-T_6+T_4-T_2$ | 0 |
| 11011 | $-T_{10}+T_8-T_6+T_4+T_2$ | $+2K[+T_3]$ |
| 11100 | $-T_{10}+T_8+T_6-T_4-T_2$ | $+2K[+T_7-T_3]$ |
| 11101 | $-T_{10}+T_8+T_6-T_4+T_2$ | $+2K[+T_7]$ |
| 11110 | $-T_{10}+T_8+T_6+T_4-T_2$ | $+2K[+T_7+T_5]$ |
| 11111 | $-T_{10}+T_8+T_6+T_4+T_2$ | $+2K[+T_7+T_5+T_3]$ |

FIG. 4 lists the required operation for each of the 32 filter RAM values. Note the 8 tap weights stored in the palette RAM listed Table 2 are arranged to allow the beautiful symmetries seen in FIG. 4 of the K transformation, distributed arithmetic and gain and timing constraints, to coincide. As a result simple control logic for example, as shown in FIG. 5 can implement the new expansion scheme of the invention.

FIG. 5 illustrates an equalization adjustment circuit 70 that expands the 8-byte compressed equalization into 32 bytes and alters the filter response by a requested cosine equalizer function implementing the operations listed in FIG. 4. An 11-bit expander counter state machine 72 having the 11-bits defined as shown in FIG. 6 provides required control signals or state machine bits for the circuit 70 including sign control for a K sign decode 74, a palette RAM terms sign decode 76 and a read address decode 78, and select bits for a 4:1 multiplexer 80, a 2:1 multiplexer 82 and a 4:1 multiplexer shifter 84 via a corresponding MUX decode block 86, 88 and 90, respectively.

A 13-bit accumulator 92 and a 2-way adder 94 implement the sequential operations or 16 4-bit cycles required for each term to be accumulated in FIG. 4. The tap weight constraint constant values $K_1$, $K_2$ are generated by a tap weight constraint constant generator 96 having a most significant bit (MSB) input from the counter state machine 72 and a 3-bit input defining interface port parameters. For the odd tap weight filter RAM portion, the initial operations of the circuit is to calculate $-T_1$. The calculated $-T_1$ result is wrapped back to a $T1/T_{10}$ holding register 98 for subsequent operations. The output of the $T1/T_{10}$ holding register 98 is applied to an inverter 100 and the inverted $-T_1$ result is coupled to the accumulator 92 via the 4:1 multiplexer 80.

One of the tap weight constraint constants $K_1$, $K_2$ is applied to an inverter 102 and the inverted result is coupled to the accumulator 92 via the 4:1 multiplexer 80. A 512×8 palette RAM 104 stores 64 compressed sets of 8 equalizations shown in TABLE 2. The addressed 8-bit palette RAM values at block 104 are applied with the K and palette RAM sign decodes to an XOR gate 106. A 32×8 digital filter RAM 108 stores the expanded 32-byte format of the expanded 8-byte compressed equalization altered by a requested cosine equalizer function.

Values of K are provided in 1/32 steps between −7/32 through +7/32. The advantage provided is that the number of possible equalization selections are increased to 64 equalizations times 15K values equal to 960 total equalizations. With the cosine equalizer represented by altered tap weights and not by a separate functional block, no processing delay is added through the signal path.

FIG. 6 provides the state machine counter bit definition as follows:

TABLE 4

| STATE MACHINE BIT DEFINITION | | |
|---|---|---|
| P0 P1 P2 P3 P4 | P5 P6 P7 P8 | P9 PA |
| 32 counts for Digital Filter RAM loading | 16 counts for Accumulator term cycles. | 4 counts for Accumulator processing. |

Operation of the equalization adjustment circuit 70 may be understood with respect to the following sequences. The following sequence listed below provides $T_1$ as the result and is loaded into the T1/T10 register while the digital filter is loaded with the first of two tap weight constraint constants. The count (P0–P4) for the following sequence equals '00000'b and the digital filter RAM address equals '01010'b for storing the tap weight constraint constant K1.

| P5 | P6 | P7 | P8 | Term to be accumulated | Condition on terms |
|---|---|---|---|---|---|
| 0 | 0 | 0 | 0 | Dummy | Unconditional |
| 0 | 0 | 0 | 1 | CONSTRAINT CONSTANT −K1 | Unconditional |

-continued

| P5 | P6 | P7 | P8 | Term to be accumulated | Condition on terms |
|---|---|---|---|---|---|
| 0 | 0 | 1 | 0 | $+(+T_3-T_5)$ | Unconditional |
| 0 | 0 | 1 | 1 | $+(+T_7-T_9)$ | Unconditional |
| 0 | 1 | 0 | 0 | $+/- \frac{1}{8}[-(-T_4-T_2)]$ | Conditional on $K(\frac{1}{8}) = "1'b$ |
| 0 | 1 | 0 | 1 | $+/- \frac{1}{8}[+(-T_4-T_2)]$ | $K(\frac{1}{8}) = "1'b$ |
| 0 | 1 | 1 | 0 | $+/- \frac{1}{8}[-(-T_8-T_6)]$ | $K(\frac{1}{8}) = "1'b$ |
| 0 | 1 | 1 | 1 | $+/- \frac{1}{8}[+(-T_8-T_6)]$ | $K(\frac{1}{8}) = "1'b$ |
| 1 | 0 | 0 | 0 | $+/- 1/16[-(-T_4-T_2)]$ | Conditional on $K(1/16) = "1'b$ |
| 1 | 0 | 0 | 1 | $+/- 1/16[+(-T_4-T_2)]$ | $K(1/16) = "1'b$ |
| 1 | 0 | 1 | 0 | $+/- 1/16[-(-T_8-T_6)]$ | $K(1/16) = "1'b$ |
| 1 | 0 | 1 | 1 | $+/- 1/16[+(-T_8-T_6)]$ | $K(1/16) = "1'b$ |
| 1 | 1 | 0 | 0 | $+/- 1/32[-(-T_4-T_2)]$ | Conditional on $K(1/32) = "1'b$ |
| 1 | 1 | 0 | 1 | $+/- 1/32[+(-T_4-T_2)]$ | $K(1/32) = "1'b$ |
| 1 | 1 | 1 | 0 | $+/- 1/32[-(-T_8-T_6)]$ | $K(1/32) = "1'b$ |
| 1 | 1 | 1 | 1 | $+/- 1/32[+(-T_8-T_6)]$ | $K(1/32) = "1'b$ |

For the next sequence, the count for digital filter loading (P0-P4) equals "00001'b and the digital filter RAM address equals '01011'b.

| P5 | P6 | P7 | P8 | Term to be accumulated | Condition on terms |
|---|---|---|---|---|---|
| 0 | 0 | 0 | 0 | Dummy | Unconditional |
| 0 | 0 | 0 | 1 | $-T_1$ | Unconditional |
| 0 | 0 | 1 | 0 | $+(+T_3-T_5)$ | Unconditional |
| 0 | 0 | 1 | 1 | $-(-T_7-T_9)$ | Unconditional |
| 0 | 1 | 0 | 0 | $+/- \frac{1}{8}[-(-T_4-T_2)]$ | Conditional on $K(\frac{1}{8}) = "1'b$ |
| 0 | 1 | 0 | 1 | $+/- \frac{1}{8}[+(-T_4-T_2)]$ | $K(\frac{1}{8}) = "1'b$ |
| 0 | 1 | 1 | 0 | $+/- \frac{1}{8}[-(-T_8-T_6)]$ | $K(\frac{1}{8}) = "1'b$ |
| 0 | 1 | 1 | 1 | $+/- \frac{1}{8}[+(+T_8-T_6)]$ | $K(\frac{1}{8}) = "1'b$ |
| 1 | 0 | 0 | 0 | $+/- 1/16[-(-T_4-T_2)]$ | Conditional on $K(1/16) = "1'b$ |
| 1 | 0 | 0 | 1 | $+/- 1/16[+(-T_4-T_2)]$ | $K(1/16) = "1'b$ |
| 1 | 0 | 1 | 0 | $+/- 1/16[-(-T_8-T_6)]$ | $K(1/16) = "1'b$ |
| 1 | 0 | 1 | 1 | $+/- 1/16[+(+T_8-T_6)]$ | $K(1/16) = "1'b$ |
| 1 | 1 | 0 | 0 | $+/- 1/32[-(-T_4-T_2)]$ | Conditional on $K(1/32) = "1'b$ |
| 1 | 1 | 0 | 1 | $+/- 1/32[+(-T_4-T_2)]$ | $K(1/32) = "1'b$ |
| 1 | 1 | 1 | 0 | $+/- 1/32[-(-T_8-T_6)]$ | $K(1/32) = "1'b$ |
| 1 | 1 | 1 | 1 | $+/- 1/32[+(+T_8-T_6)]$ | $K(1/32) = "1'b$ |

At the end of the following sequence listed below the (P5-P8) count provides $T_{10}$ as the result and is loaded into the T1/T10 register while the digital filter is loaded with the second of two tap weight constraint constants K2. The count for digital filter loading (P0-P4) equals '10000'b and the digital filter RAM address equals '11010'b.

| P5 | P6 | P7 | P8 | Term to be accumulated | Condition on terms |
|---|---|---|---|---|---|
| 0 | 0 | 0 | 0 | Dummy | Unconditional |
| 0 | 0 | 0 | 1 | CONSTRAINT CONSTANT $-$K2 | Unconditional |
| 0 | 0 | 1 | 0 | $+(+T_8-T_6)$ | Unconditional |
| 0 | 0 | 1 | 1 | $+(+T_4-T_2)$ | Unconditional |
| 0 | 1 | 0 | 0 | $+/- \frac{1}{8}[-(-T_7-T_9)]$ | Conditional on $K(\frac{1}{8}) = "1'b$ |
| 0 | 1 | 0 | 1 | $+/- \frac{1}{8}[+(-T_7-T_9)]$ | $K(\frac{1}{8}) = "1'b$ |
| 0 | 1 | 1 | 0 | $+/- \frac{1}{8}[-(-T_3-T_5)]$ | $K(\frac{1}{8}) = "1'b$ |
| 0 | 1 | 1 | 1 | $+/- \frac{1}{8}[+(-T_3-T_5)]$ | $K(\frac{1}{8}) = "1'b$ |
| 1 | 0 | 0 | 0 | $+/- 1/16[-(-T_7-T_9)]$ | Conditional on $K(1/16) = "1'b$ |
| 1 | 0 | 0 | 1 | $+/- 1/16[+(-T_7-T_9)]$ | $K(1/16) = "1'b$ |
| 1 | 0 | 1 | 0 | $+/- 1/16[-(-T_3-T_5)]$ | $K(1/16) = "1'b$ |
| 1 | 0 | 1 | 1 | $+/- 1/16[+(-T_3-T_5)]$ | $K(1/16) = "1'b$ |
| 1 | 1 | 0 | 0 | $+/- 1/32[-(-T_7-T_9)]$ | Conditional on $K(1/32) = "1'b$ |
| 1 | 1 | 0 | 1 | $+/- 1/32[+(-T_7-T_9)]$ | $K(1/32) = "1'b$ |
| 1 | 1 | 1 | 0 | $+/- 1/32[-(-T_3-T_5)]$ | $K(1/32) = "1'b$ |
| 1 | 1 | 1 | 1 | $+/- 1/32[+(-T_3-T_5)]$ | $K(1/32) = "1'b$ |

Next the count for digital filter lading (P0-P4) equals "10001'b and the digital filter RAM address equals '11011'b.

| P5 | P6 | P7 | P8 | Term to be accumulated | Condition on terms |
|---|---|---|---|---|---|
| 0 | 0 | 0 | 0 | Dummy | Unconditional |
| 0 | 0 | 0 | 1 | $-T_{10}$ | Unconditional |
| 0 | 0 | 1 | 0 | $+(+T_8-T_6)$ | Unconditional |
| 0 | 0 | 1 | 1 | $-(+T_4-T_2)$ | Unconditional |
| 0 | 1 | 0 | 0 | $+/- \frac{1}{8}[-(-T_7-T_9)]$ | Conditional on $K(\frac{1}{8}) = "1'b$ |
| 0 | 1 | 0 | 1 | $+/- \frac{1}{8}[+(-T_7-T_9)]$ | $K(\frac{1}{8}) = "1'b$ |
| 0 | 1 | 1 | 0 | $+/- \frac{1}{8}[-(-T_3-T_5)]$ | $K(\frac{1}{8}) = "1'b$ |
| 0 | 1 | 1 | 1 | $+/- \frac{1}{8}[+(+T_3-T_5)]$ | $K(\frac{1}{8}) = "1'b$ |
| 1 | 0 | 0 | 0 | $+/- 1/16[-(-T_7-T_9)]$ | Conditional on $K(1/16) = "1'b$ |
| 1 | 0 | 0 | 1 | $+/- 1/16[+(-T_7-T_9)]$ | $K(1/16) = "1'b$ |
| 1 | 0 | 1 | 0 | $+/- 1/16[-(-T_3-T_5)]$ | $K(1/16) = "1'b$ |
| 1 | 0 | 1 | 1 | $+/- 1/16[+(+T_3-T_5)]$ | $K(1/16) = "1'b$ |
| 1 | 1 | 0 | 0 | $+/- 1/32[-(-T_7-T_9)]$ | Conditional on $K(1/32) = "1'b$ |
| 1 | 1 | 0 | 1 | $+/- 1/32[+(-T_7-T_9)]$ | $K(1/32) = "1'b$ |
| 1 | 1 | 1 | 0 | $+/- 1/32[-(-T_3-T_5)]$ | $K(1/32) = "1'b$ |
| 1 | 1 | 1 | 1 | $+/- 1/32[+(+T_3-T_5)]$ | $K(1/32) = "1'b$ |

In brief summary, the present invention provides the advantages of a cosine adjust filter without actually implementing a separate logic block, thereby saving power and cost, while allowing robustness of the design at high data rats.

Finally, it should be understood that an adaptive feature can be provided with the current automatic equalization method by implementing periodic updates for normally static equalization values based upon generalized error measurement (GEM) feedback. An update of manufacturing constants can be provided in the disk file 10 periodically at a more appropriate rate than that forced by a purely adaptive scheme.

While the invention has been described with reference to details of the illustrated embodiment, these details are not intended to limit the scope of the invention as defined in the appended claims.

What is claimed and desired to be secured by Letters Patent of the United States is:

1. Apparatus for providing equalization adjustment for a finite impulse response (FIR) digital filter having T taps comprising:
   first memory means for storing a plurality of partial sums of predetermined tap weights;
   means for generating an odd tap weight constant value and an even tap weight constant value;
   each of said odd tap weight constant value and said even tap weight constant value defining a predetermined filter coefficient;
   means for calculating a predetermined odd tap weight and a predetermined even tap weight using respective selected ones of said stored partial sums and said generated odd tap weight constant value and said generated even tap weight constant value;
   means for calculating predetermined filter coefficients using said calculated predetermined odd and even tap weights, predefined ones of said stored partial sums, and a selected multiple of predefined different ones of the stored partial sums;

second memory means for storing said calculated filter coefficients.

2. Apparatus as recited in claim 1 wherein said selected multiple includes a selected one of a plurality of predetermined values.

3. Apparatus as recited in claim 2 wherein said plurality of predetermined values include 1/32 step values between $-7/32$ and $+7/32$.

4. Apparatus as recited in claim 3 wherein said T taps equals 10 and 64 sets of both 4 partial sums of predetermined odd tap weights and 4 partial sums of predetermined even tap weights are stored in an addressable random access first memory means.

5. Apparatus as recited in claim 4 wherein said generated odd tap weight constant value equals $K_1$ used for calculating said predetermined odd tap weight and said even tap weight constant value equals $K_2$ used for calculating said predetermined even tap weight and each said predetermined filter coefficient defined by $K_1$ and $K_2$ has a cosine adjustment value of zero.

6. Apparatus as recited in claim 5 wherein said calculating means includes an 11-bit counter state machine including bits P0 P1 P2 P3 P4 P5 P6 P7 P8 P9 PA and having a predefined bit definition with bits P0 P1 P2 P3 P4 P5 providing 32 counts for loading said calculated filter coefficients in said second memory means.

7. Apparatus as recited in claim 6 wherein said calculating means includes an accumulator for accumulating said calculated predetermined odd tap weight, said selected ones of said stored partial sums, and said selected multiple of predefined different ones of the stored partial sums for calculating predefined odd filter coefficients; said accumulator for accumulating said calculated predetermined even tap weight, said selected ones of said stored partial sums, and said selected multiple of predefined different ones of the stored partial sums for calculating predefined even filter coefficients and said 11-bit counter state machine bits P5 P6 P7 P8 providing 16 counts for accumulator term cycles and bits P9 PA providing 4 counts for accumulator processing.

8. Apparatus as recited in claim 7 wherein said calculating means includes a 2-way adder and said first memory means and said accumulator are coupled to said 2-way adder.

9. A method for providing equalization adjustment of a finite impulse response (FIR) digital filter having T taps comprising the steps of:
storing partial sums of predetermined odd tap weights and partial sums of predetermined even tap weights using a palette RAM;
generating an odd tap weight constraint constant value and an even tap weight constraint constant value using a tap weight constraint generator;
calculating a predetermined odd tap weight by adding said odd tap weight constraint constant value and predefined ones of said stored partial sums of predetermined odd tap weights;
storing said calculated predetermined odd tap weight in a holding register;
storing said odd tap weight constraint constant value in a random access memory (RAM) within the finite impulse response (FIR) digital filter for a predetermined filter coefficient having a cosine adjustment equal to zero;
calculating predetermined filter coefficients using an accumulator, an adder and a multiplexer for sequentially accumulating said calculated predetermined tap weight, predetermined ones of said stored partial sums of predetermined odd tap weights and a selected multiple of predefined ones of said stored partial sums of predetermined even tap weights;
calculating a predetermined even tap weight by adding said even tap weight constrain constant value and predefined ones of said stored partial sums of predetermined even tap weights;
storing said calculated predetermined even tap weight in said holding register;
storing said even tap weight constraint constant value in said random access memory (RAM) within the finite impulse response (FIR) digital filter for a predetermined filter coefficient having a cosine adjustment equal to zero;
calculating predetermined filter coefficients using an accumulator, an adder and a multiplexer for sequentially accumulating said calculated predetermined even tap weight, predefined ones of said stored partial sums of predetermined even tap weights and a selected multiple of predetermined ones of predetermined odd tap weights; and
supplying each said calculated predetermined filter coefficients to said random access memory (RAM) within the finite impulse response (FIR) digital filter to provide equalization adjustment thereof.

10. A method for equalization adjustment of a finite impulse response (FIR) digital filter having T taps comprising the steps of:
identifying initial effective tap weight values by reading stored filter coefficients in a random access memory (RAM) within the finite impulse response (FIR) digital filter;
calculating modified effective tap weight values by adding each said initial effective tap weight value with a selected cosine equalization adjustment function; and
supplying said calculated modified effective tap weight values to the finite impulse response (FIR) digital filter by loading said RAM for equalization adjustment of each digital filter RAM value.

11. A method as recited in claim 10 wherein said initial effective tap weight values are represented by $T(n)$ and wherein said calculating step includes the steps of calculating modified effective tap weight values represented by $T(n)'$:

$$T_1' = T_1 + KT_2$$

$$T_2' = T_2 + KT_3$$

$$T_3' = KT_2 + T_3 + KT_4$$

$$T_4' = KT_3 + T_4 + KT_5$$

$$T_5' = KT_4 + T_5 + KT_6$$

$$T_6' = KT_5 + T_6 + KT_7$$

$$T_7' = KT_6 + T_6 + KT_8$$

$$T_8' = KT_7 + T_8 + KT_9$$

$$T_9' = KT_8 + T_9$$

$$T_{10}' = KT_9 + T_{10}.$$

12. A method as recited in claim 10 wherein said T equals 10 taps and 32 transformations $Y_0-Y_{31}$ are calculated as defined by:

$$Y_{COUNTER} = X_{COUNTER} + K[X_{INDEX1} - X_{INDEX2}],$$

where $COUNTER = [C_{16}C_8C_4C_2C_2]B$, $INDEX1 = [\overline{C_{16}C_1}C_2C_4C_8]B$ and $INDEX2 = [\overline{C_{16}C_8C_4C_2}1]B$.

13. A direct access storage device of the type including a partial-response maximum-likelihood (PRML) data channel comprising:
   a housing;
   at least one disk mounted in said housing for rotation about an axis and having at least one disk surface for storing data;
   transducer means mounted for movement across said disk surface for reading and writing data to said disk surface;
   a digital filter in said PRML data channel coupled to said transducer means for filtering digital sample values, said digital filter including;
   first memory means for storing a plurality of partial sums of predetermined tap weights;
   means for generating an odd tap weight constant value and an even tap weight constant value; each of said odd tap weight constant value and said even tap weight constant value defining a predetermined filter coefficient;
   means for calculating a predetermined odd tap weight and a predetermined even tap weight using respective selected ones of said stored partial sums and said generated odd tap weight constant value and said generated even tap weight constant value;
   means for calculating predetermined filter coefficients using said calculated predetermined odd and even tap weights, predefined ones of said stored partial sums, and a selected multiple of predefined different ones of the stored partial sums; and
   second memory means for storing said calculated filter coefficients.

* * * * *

UNITED STATES PATENT AND TRADEMARK OFFICE
CERTIFICATE OF CORRECTION

PATENT NO. : 5,268,848

DATED : December 7, 1993

INVENTOR(S) : Coker et al.

It is certified that error appears in the above-identified patent and that said Letters Patent is hereby corrected as shown below:

At column 1, lines 49-50 should be changed from "U.S. patent application Ser. No. 07/851,817 filed Mar. 16, 1992" to --U.S. patent No. 5,258,940, issued Nov. 2, 1993--;

Column 5, line 16, the equation "$Y_{17} = X_{17} + K(X_8-X_{15}$" should be changed to --$Y_{17} = X_{17} + K(X_8-X_{15})$--;

Column 6, line 56, "si" should be changed to --is--;

Column 7, line 38, the Base Entry equation "$-T_1+T_3-T_5-T_7-T_9$" at ADDR 01010 should be changed to -- $-T_1+T_3-T_5+T_7-T_9$--;

Column 10, line 16, the Term to be accumulated equation "$-(+T_4-T_2)$" should be changed to -- $-(-T_4-T_2)$--;

Column 12, claim 9, line 1, "predetermined" should be changed to --predefined--; and Column 12, claim 9, line 22, "predetermined" should be changed to --predefined--.

Signed and Sealed this

Fourteenth Day of June, 1994

*Attest:*

BRUCE LEHMAN

*Attesting Officer*     *Commissioner of Patents and Trademarks*